(12) United States Patent
Maillard et al.

(10) Patent No.: US 10,574,214 B1
(45) Date of Patent: Feb. 25, 2020

(54) CIRCUIT FOR AND METHOD OF STORING DATA IN AN INTEGRATED CIRCUIT DEVICE

(71) Applicant: Xilinx, Inc., San Jose, CA (US)

(72) Inventors: Pierre Maillard, Campbell, CA (US); Yanran Chen, San Jose, CA (US); Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/137,405

(22) Filed: Sep. 20, 2018

(51) Int. Cl.
| | |
|---|---|
| H03K 3/037 | (2006.01) |
| H03K 19/17764 | (2020.01) |
| H03K 19/1776 | (2020.01) |
| H03K 19/177 | (2006.01) |
| H03K 3/3562 | (2006.01) |

(52) U.S. Cl.
CPC ......... H03K 3/0375 (2013.01); H03K 3/0372 (2013.01); H03K 19/1776 (2013.01); H03K 19/17764 (2013.01); H03K 3/35625 (2013.01)

(58) Field of Classification Search
CPC .... H03K 19/215; H03K 17/04; H03K 17/693; H03K 3/356043; H03K 3/3562; H03K 19/00315; H03K 19/0948
USPC ................................. 327/199, 200, 201, 202
See application file for complete search history.

(56) References Cited

U.S. PATENT DOCUMENTS

| | | | |
|---|---|---|---|
| 7,036,059 B1 | 4/2006 | Carmichael et al. | |
| 7,064,574 B1 | 6/2006 | Voogel et al. | |
| 7,218,160 B2 * | 5/2007 | Wada .................... | H03K 3/012 |
| | | | 326/95 |
| 7,310,759 B1 | 12/2007 | Carmichael et al. | |
| 7,383,479 B1 | 6/2008 | Carmichael et al. | |
| 7,512,871 B1 | 3/2009 | Carmichael et al. | |
| 7,525,362 B1 | 4/2009 | Lesea et al. | |
| 7,539,926 B1 | 5/2009 | Lesea | |
| 7,620,883 B1 | 11/2009 | Carmichael et al. | |
| 7,764,081 B1 | 7/2010 | Tuan et al. | |
| 7,907,461 B1 | 3/2011 | Nguyen et al. | |
| 8,981,491 B1 | 3/2015 | Hart et al. | |
| 9,058,853 B2 | 6/2015 | Hart et al. | |
| 9,236,353 B2 | 1/2016 | Jain et al. | |
| 9,281,807 B1 | 3/2016 | Maillard et al. | |
| 9,379,109 B1 | 6/2016 | Karp et al. | |
| 9,852,632 B2 | 12/2017 | Sempuku | |

* cited by examiner

*Primary Examiner* — John W Poos
(74) *Attorney, Agent, or Firm* — John J. King

(57) ABSTRACT

A circuit for storing data in an integrated circuit is described. The circuit comprises an input adapted to receive the data; a memory element coupled to the input, the memory element comprising a storage node for storing the data; at least one node that is separate from the storage node for storing the data; and at least a portion of a dummy transistor coupled to the at least one node that is separate from the storage node for storing the data. A method of storing data in an integrated circuit is also described.

16 Claims, 7 Drawing Sheets

US 10,574,214 B1

CIRCUIT FOR AND METHOD OF STORING DATA IN AN INTEGRATED CIRCUIT DEVICE

TECHNICAL FIELD

The present invention relates generally to integrated circuit devices, and in particular, to a circuit for and a method of storing data in an integrated circuit device.

BACKGROUND

Memory elements, such as D flip-flops (DFF), are subject to upset from cosmic neutrons and terrestrial alpha particles, which can result in systematic errors in an integrated circuit device having memory elements. The failure rate associated with these upsets is commonly known as a Soft Error Rate (SER). An industrial metric used to quantify the SER of the circuit is known as Failure In Time (FIT) rate or FIT/Mb. A sensitive area may be an area that can collect charge from energetic particles to cause a soft error, and is usually referred to a reverse-biased drain.

In advanced technology nodes, dummy gates/transistors are often used and/or required by design rules to enable compact layout by maintaining continuity of one or both of a diffusion area and polysilicon gate lines. While the addition of the dummy gate/transistor does not affect the functionality of the FF cell, these dummy gates/transistors at sensitive nodes of the memory devices add up to the overall sensitive areas of the memory devices, and therefore increase the device FIT rate.

Further, memory elements may have an asymmetry with respect to storing a logical "0" or logical "1", where the asymmetry may be the result of parasitic dummy gates for example. For an integrated circuit produced using a 7 nm FF (i.e. a 7 nm gate width), a 3-5 times FIT asymmetry can be observed between '0' and '1', while another integrated circuit using another 7 nm FF may experience 10-100 times FIT asymmetry between '1' and '0'.

Accordingly, there is a need for a memory cell that improves the FIT rate.

SUMMARY

A circuit for storing data in an integrated circuit is described. The circuit comprises an input adapted to receive the data; a memory element coupled to the input, the memory element comprising a storage node for storing the data; at least one node that is separate from the storage node for storing the data; and at least a portion of a dummy transistor coupled to the at least one node that is separate from the storage node for storing the data.

A method of storing data in an integrated circuit is also described. The method comprises configuring an input to receive the data; coupling a memory element to the input, the memory element comprising a storage node for storing the data; providing at least one node that is separate from the storage node for storing the data; and coupling at least a portion of a dummy transistor to the at least one node that is separate from the storage node for storing the data.

Another method of storing data in an integrated circuit comprises configuring an input to receive the data; coupling a memory element to the input, the memory element comprising a storage node for storing the data; and coupling a selected value to the storage node; wherein the selected value coupled to the storage node enables the memory element in to operate at a low FIT rate.

DETAILED DESCRIPTION

The circuits and methods of storing data in an integrated circuit improve the SER of a flip-flop, such as a DFF, by moving the dummy gate/transistor nodes away from sensitive nodes (i.e. Q and Q_bar of a FF latch). According to one implementation, a dummy-induced additional sensitive area at storage node is moved to non-storage node that have no observable impact on the cell single event upset (SEU) FIT rate. The circuits and methods may reduce the overall neutron and alpha particle FIT rate of a FF by 10 times or more with minimal area and performance penalties.

According to other implementations, circuits and methods improve the FF-induced system Soft Error Rate (SER) in programmable logic or other logic devices or semiconductor products by selectively configuring memory elements to receive a logical zero or logical one at an input. The circuits and methods utilize the inherent tendency of the FF to be more resilient to SEU for a given input (i.e. either '0' or '1') to minimize the device FIT rate. The FF FIT asymmetry for inputs '0' or '1' is used for device initialization and/or synthesis to reduce the overall FIT. The circuits and methods reduce the overall field programmable gate array (FPGA) SER FIT rate by using FFs in the low-FIT rate state, especially when unused if connected to other used circuitry. For each type of FF of an integrated circuit device, it is determined whether an '1' or '0' as an input results in a "better state" or a "worse state" depending on which input corresponds to the better or worse SEU FIT rate.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
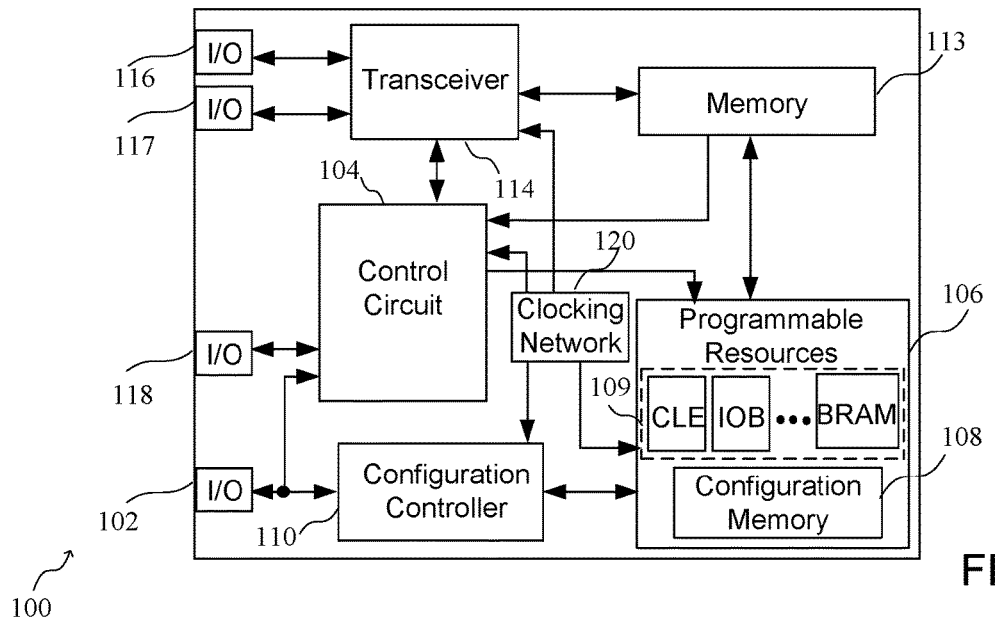
FIG. 1 is a block diagram of an integrated circuit having circuits for storing data.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114, which comprises a transmitter and a receiver, may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods for storing data could related to any memory elements of the integrated circuit, including memory elements used for configuring the programmable resources of FIG. 1. Additional information related to programmable resources is provided in FIGS. 11 and 12. While the circuit of FIG. 1 is provided by way of example, other circuits for implementing memory elements and other circuits for storing data in memory elements could be used.

Figure 2:
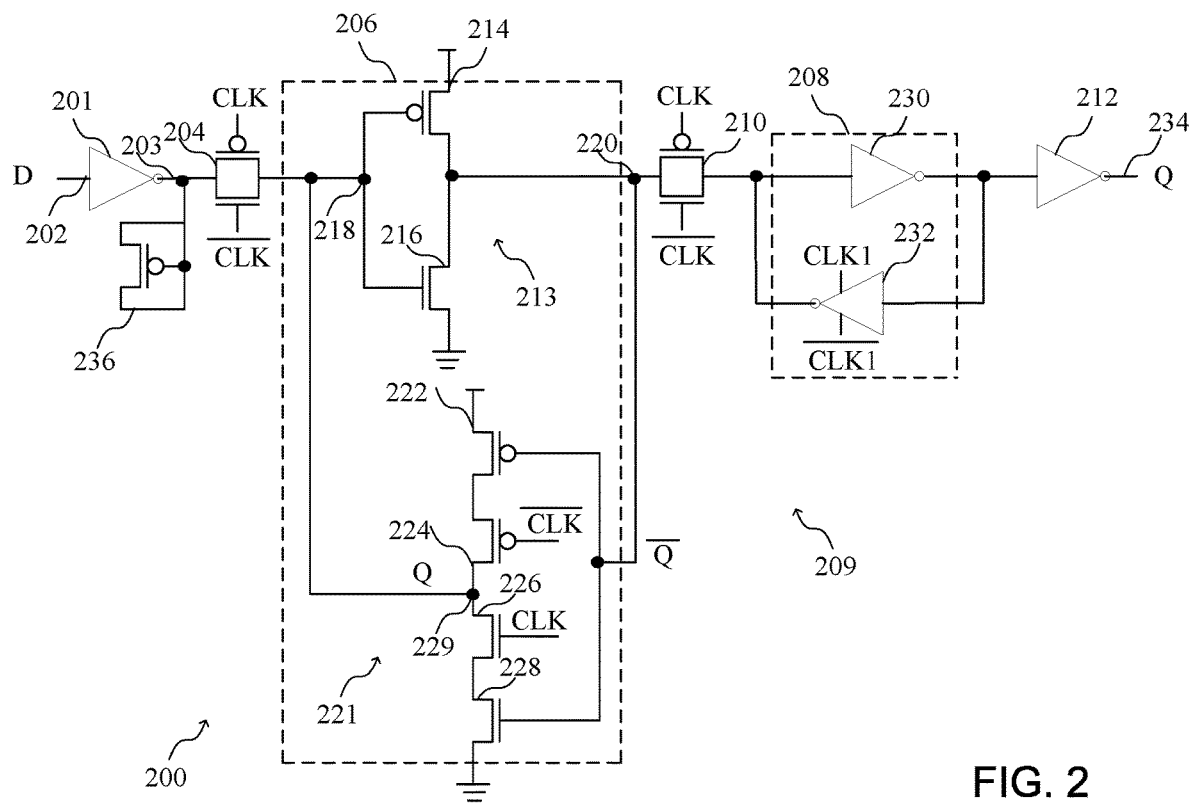
FIG. 2 is a block diagram of a circuit for storing data in an integrated circuit device.

Turning now to FIG. 2, a block diagram of a circuit 200 for storing data in an integrated circuit device is shown. The circuit 200 comprises an inverter 201 having an input 202 configured to receive data (D) and an output 203, comprising a node that is separate from a storage node, coupled to a pass gate 204, shown by way of example as a complementary MOS (CMOS) pass gate having both a PMOS transistor and an NMOS transistor. A node may be considered separate from a storage node if it is not directly electrically connected to the storage node. However, it should be understood that any other type of pass gate, including a single transistor pass gate, could be used. The pass gate 204 is coupled to a first portion 206 of a memory element 209, which may be a master latch for example, an output of which is coupled to second portion 208 of the memory element 209, which may be a slave latch for example, by way of another pass gate 210. An output of the second portion of the memory element may be coupled to an inverter 212. The signal at the output 220 is the generated output data known as the Q signal.

According to one implementation, each of the first portion 206 of the memory elements and the second portion 208 of the memory element may comprise a pair of cross-coupled inverters, where the first portion 206 comprises a master portion and the second portion 208 comprises a slave portion. More particularly, the first portion 206 of the memory element comprises a first inverter 213 having a P-channel transistor 214 coupled in series with an N-channel transistor 216. An input 218 of the first inverter 213, which is a storage node for the data (D) is coupled to the gates of the transistors 214 and 216. An output 220 of the inverter 213 is coupled to an input of a second inverter 221. The second inverter 221 comprises a plurality of transistors coupled in series. The inverter 221 comprises a P-channel transistor 222, a P-channel transistor 224, an N-channel transistor 226, and an N-channel transistor 228. The gates of transistors 222 and 228 are coupled to receive the Q_bar signal, while the gates of transistors 224 and 226 are configured to receive the inverted clock (CLK_bar) and the clock (CLK) signals, respectively. The Q signal is generated at the output 229 (i.e. at the drains of transistors 224 and 226). The second portion 208 of the memory element comprises a pair of cross-coupled inverters 230 and 232 to generate the output signal Q at an output 234, where the inverters 230 and 232 could be implemented as described for inverters 213 and 221.

According to the implementation of the circuit 200 of FIG. 2, one or more dummy transistors could be implemented in the circuit, where a dummy transistor could be any transistor or portion or elements of a transistor that does not provide circuit functionality, but may provide some other benefit, such as a structural benefit or meet a requirement for the manufacture of the integrated circuit device. For example, dummy gates or dummy transistors may be used and even required by design rules to enable compact layout by maintaining continuity of diffusion regions and polysilicon gate lines. While the elements of the dummy transistor may be present as structural elements of the integrated circuit device, they may not be physically connected to form active portions of a circuit implemented in the integrated circuit device. According to the implementation of FIG. 2, an additional "dummy" transistor 236 is coupled to the output 203 of the inverter 201. According to the implementation of FIG. 3 describing another circuit 300 for storing data in an integrated circuit device, a transistor 302 is coupled to a node 304 at the drain of the transistor 222 and the source of transistor 224 of the inverter 221. While P-channel dummy transistors are shown by way of example in FIGS. 2 and 3, it should be understood that N-channel transistors could also be implemented as dummy transistors.

Figure 3:
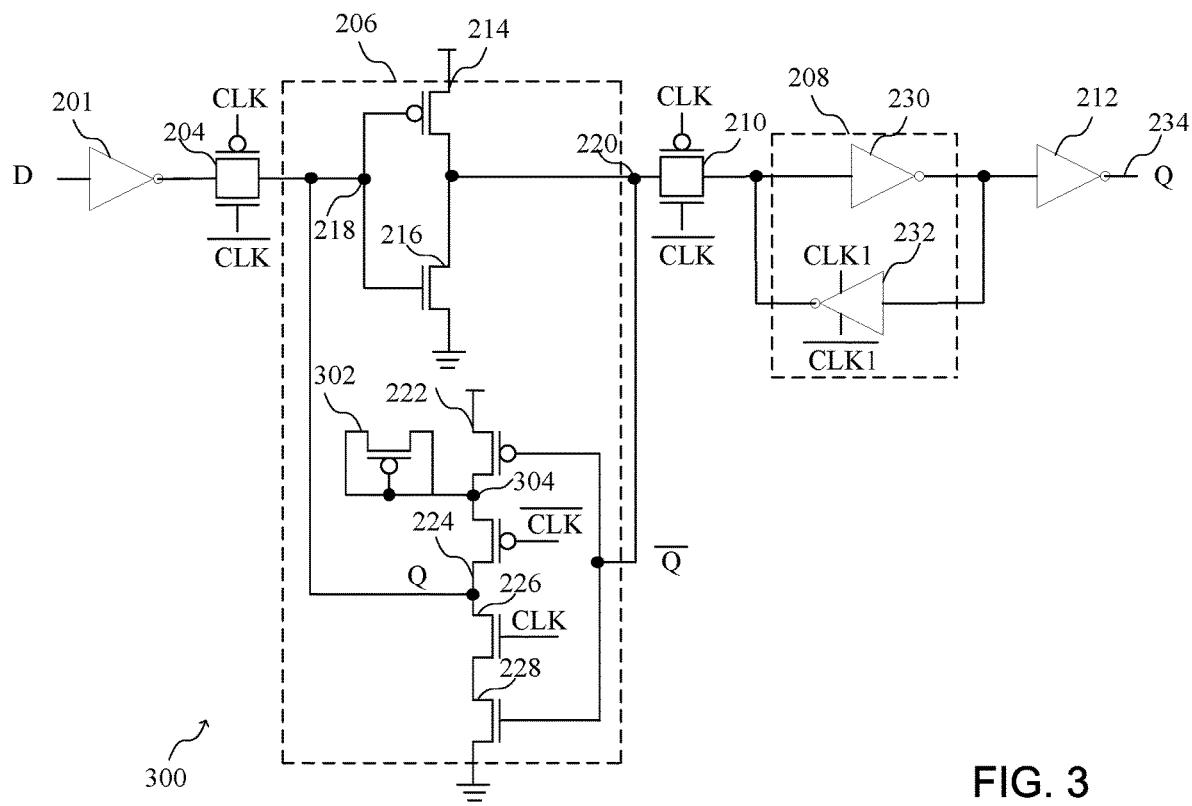
FIG. 3 is a block diagram of another circuit for storing data in an integrated circuit device.

By placing the dummy transistors (e.g. transistors 236 or 302) at node other than data storage nodes, the FIT rate of the memory element (i.e. the master portion 206 and the slave portion 208) is decreased. That is, the overall DFF SEU sensitive area is reduced by optimally placing and/or relocating the dummy gates/transistors in a FF cell away from the storage nodes to non-storage nodes, without adding to the overall FF area. By way of example, storage nodes may include input/output nodes of the cross-coupled inverter pair in both the master/slave latches. Further by way of example, non-storage nodes may include reference nodes (e.g. power (VDD) or ground (GND) nodes), input/output buffer output nodes (as shown for example in FIG. 2), and intermediate voltage nodes in stacked transistors (as shown for example in FIG. 3). By relocating the dummy gates/transistors from sensitive nodes to less sensitive nodes, the FF SEU FIT rate of the integrated circuit device can be improved by up to 10 times without any area or performance penalty. While the dummy transistors of FIG. 2 or 3 are shown coupled to a node of the first portion 206 of the memory element, it should be understood that the dummy transistor could instead or also be implemented with the second portion of the memory element 208.

Figure 4:
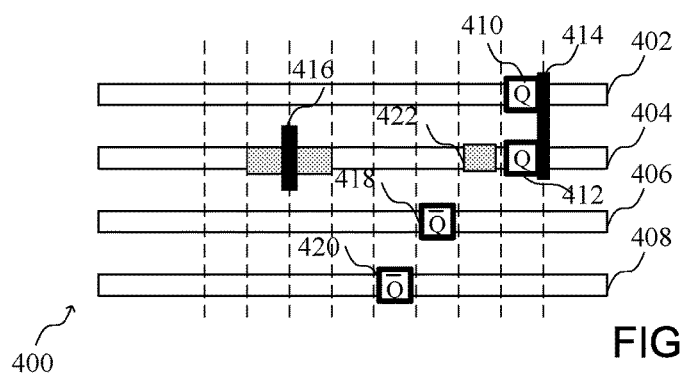
FIG. 4 is a diagram showing an arrangement of elements of a circuit for storing data in an integrated circuit device.

Turning now to FIG. 4, a diagram showing an arrangement of elements of a circuit for storing data in an integrated circuit device is shown. FIG. 4 shows the arrangement of transistors, and more particularly, how placing a dummy transistor at a non-storage node isolates the transistor from a storage node, and therefore reduces the chance for an upset. The portion 400 of an integrated circuit comprises a plurality of rows 402-408 showing areas having diffusion regions for transistors. Some contacts (at sources or drains of transistors) and polysilicon layers for gates of the transistors are shown by way of example to illustrate how the selection of the placement of dummy transistors could affect the chances of an upset event. A first source or drain node 410 and a source or drain node 412 are coupled to the Q node, where first and second transistors have a common gate polysilicon 414. By way of example, a dummy transistor 416 has source and drain regions in the row 404 of diffusion regions, but away from the Q nodes 410 and 412 and the Q_bar nodes 418 and 420. In contrast, if a node of dummy transistor is electrically connected to a storage node, such as node 422 connected to storage node Q at node 413, there is an increased likelihood of an upset of data stored in the memory cell implemented in the portion 400 of the integrated circuit.

Figure 5:
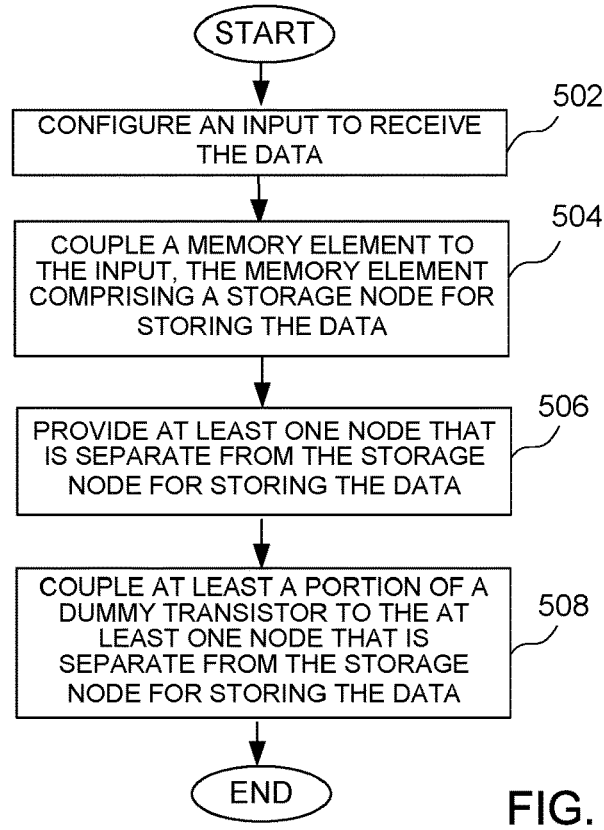
FIG. 5 is a flow chart showing a method for storing data in an integrated circuit device.

Turning now to FIG. 5, a flow chart showing a method for storing data in an integrated circuit device is shown. An input is configured to receive the data at a block 502. A memory element, such as memory element 206, is coupled to the input, the memory element comprising a storage node for storing the data (e.g. Q) at a block 504. At least one node that is separate from the storage node for storing the data is provided at a block 506. At least a portion of a dummy transistor, such as transistor 236 or transistor 302, is coupled to the at least one node that is separate from the storage node for storing the data at a block 508.

The method of FIG. 5 may be implemented using the circuits of FIGS. 1-4 as described, or using some other suitable circuits. While specific elements of the method are described, it should be understood that additional elements of the method, or additional details related to the elements, could be implemented according to the disclosure of FIGS. 1-4.

Figure 6:
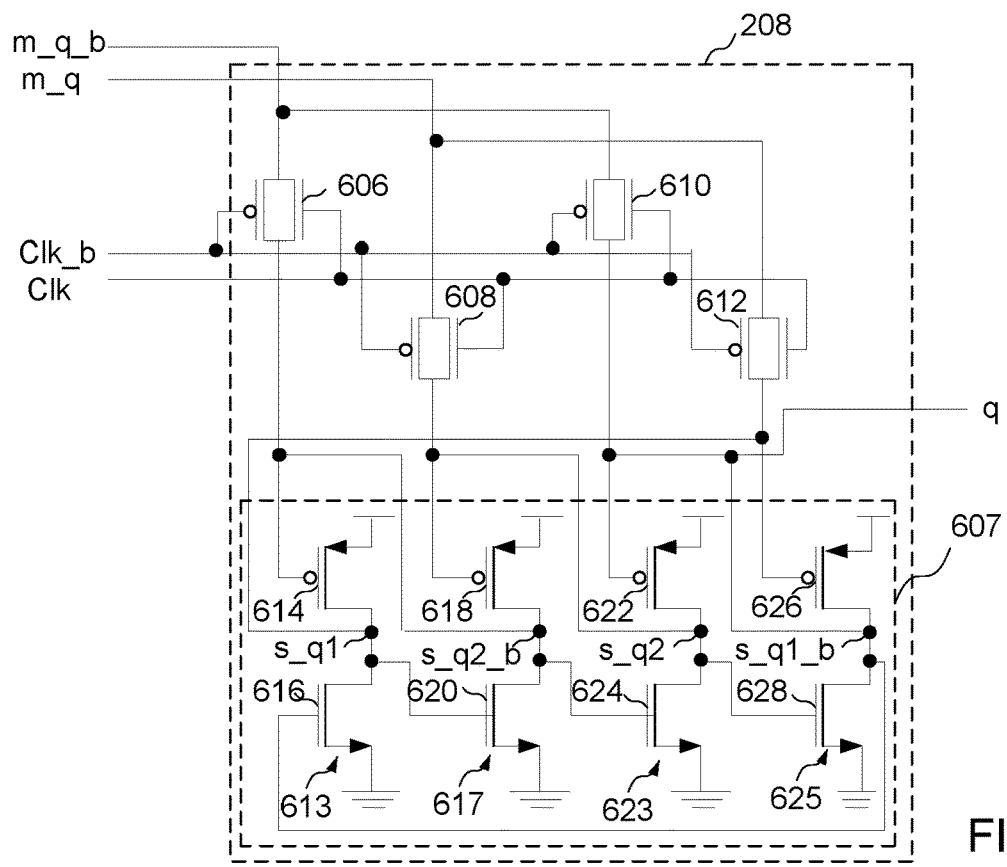
FIG. 6 is a block diagram of a DICE memory cell.

Turning now to FIG. 6, a block diagram showing details of a slave flip-flop of a DFF, which may be implemented as the second portion 208 of the memory element (i.e. the slave latch). As described above, different memory elements may have different SER FIT rates depending upon whether a logical "1" is provided to the input and stored in the memory element or a logical "0" is provided to the input and stored in the memory element. For example, a master-slave flip-flop arrangement of FIG. 2 has each of the master portion and the slave portion implemented as a latch. Another arrangement of a master-slave flip-flop may include a dual-interlocked cell (DICE) as the slave portion 208. However, a configuration having a latch as a master portion of the master-slave memory element and a DICE cell as a slave portion of the memory element may have a different SER FIT rates depending upon whether a logical "1" is provided to the input and stored in the memory element or a logical "0" is provided to the input and stored in the memory element. When an integrated circuit device comprises different types of memory elements (e.g. a master slave memory element having latches as both the master and slave portions as in FIG. 2 or a master slave memory element having a DICE cell as described below in reference to FIG. 6 as the slave portion), the SER FIT rate of the integrated circuit device may be reduced if either a logical "0" or logical "1" is selectively applied to the inputs of the memory elements based upon whether the particular memory element has a lower FIT rate when a logical "0" or a logical "1" is provided at the input, as will be described in more detail below.

According to the implementation of FIG. 6, the slave portion 208 of a master-slave pair is an SEU-enhanced flip-flop which enables self-correction. That is, slave flip-flop 208 is implemented as a dual-interlocked cell (DICE). As will be described in more detail below, the logic state of each of the four nodes of the DICE cell is controlled by two adjacent nodes. The arrangement enables restoring the correct logic state at two perturbed nodes on an opposite diagonal. The DICE cell prevents unintended changes in the memory because two nodes on each diagonal do not depend directly on one another, but are controlled by the two nodes of the other diagonal. While a DICE cell is shown by way of example, other SEU-enhanced flip-flops could be implemented.

The inverters in the slave section comprise transistors which are selectively connected to the true and complement internal nodes from the master section through pass gates. The data and inverted data (m_q and m_q_b) at the outputs of the master portion are coupled to the pass gates of the circuit 208. In particular, the data and inverted data are provided to a plurality of pass gates, each comprising a pair of transistors which are controlled by the clock and inverted clock signals, clkbr and clkbr_b respectively. The output of the pass gate 606 is coupled to an inverter circuit 607, and in particular to an inverter 613 at a gate of a transistor 614 having a source pulled high and a drain coupled to a drain of a transistor 616 which has a source coupled to ground. The node of the inverter 613 at the connection of the drain of transistor 614 and the drain of transistor 616 comprises an inverter node. The gate of transistor 616 is controlled by an inverter node of another path of the slave flip-flop, as will be described below. The pass gate 608 also comprises a pair of transistors and has an output coupled to an inverter 617 comprising a transistor 618 and a transistor 620. The node at the drain of the transistors 618 and the source of the transistor 620 generates an inverted slave output signal s_q2_b. The output of the pass gate 608 is coupled to the gate of the transistor 618 which has a source pulled high and a drain coupled to the drain of the transistor 620. The gate of transistor 620 is coupled to receive the slave output signal s_q1 at the inverter node between transistors 614 and 616.

Two additional stages also receive the output of the master flip-flop. In particular, the m_q_b output is coupled to a pass gate 610, comprising a pair of transistors which are also controlled by a clock and inverted clock signal, clkbr and clkbr_b respectively. The output of the pass gate 610 is coupled to a gate of a transistor 622 of an inverter 623 having a source pulled high and a drain coupled to a drain of a transistor 624 which has a source coupled to ground. The node at the connection of the drain of transistor 622 and the drain of transistor 624 comprises an inverter node that generates an output signal s_q2. The gate of transistor 624 is controlled by the inverted slave output signal s_q2_b at the inverter node of the inverter created by transistors 618 and 620. The pass gate 612 also comprises a pair of transistors and has an output coupled to an inverter 625 comprising a transistor 626 and a transistor 628. The output of the pass gate 612 is coupled to the gate of the transistor 626 which has a source pulled high and a drain coupled to the drain of the transistor 628 to receive the s_q2 signal. The gate of transistor 628 is coupled to receive the signal at the inverter node between transistors 622 and 624. The node at the drain of the transistor 626 and the source of the transistor 628 is coupled to the gate of the transistor 616, which receives the inverted slave output s_q1_b The slave flip-flop 208 of the master-slave pair enables self-correction by coupling output nodes of a stage to a gate of a transistor of another stage. In particular, the node at the drains of transistors 614 and 616 are coupled to the output of pass gate 612, the node at the drains of transistors 618 and 620 are coupled to the output of pass gate 606, the node at the drains of transistors 622 and 624 are coupled to the output of pass gate 606, and the node at the drains of transistors 626 and 628 are coupled to the output of pass gate 610. Accordingly, the circuit of FIG. 6 advantageously provides a master-slave flip-flop having an SEU-enhanced slave flip-flop.

Figure 7:
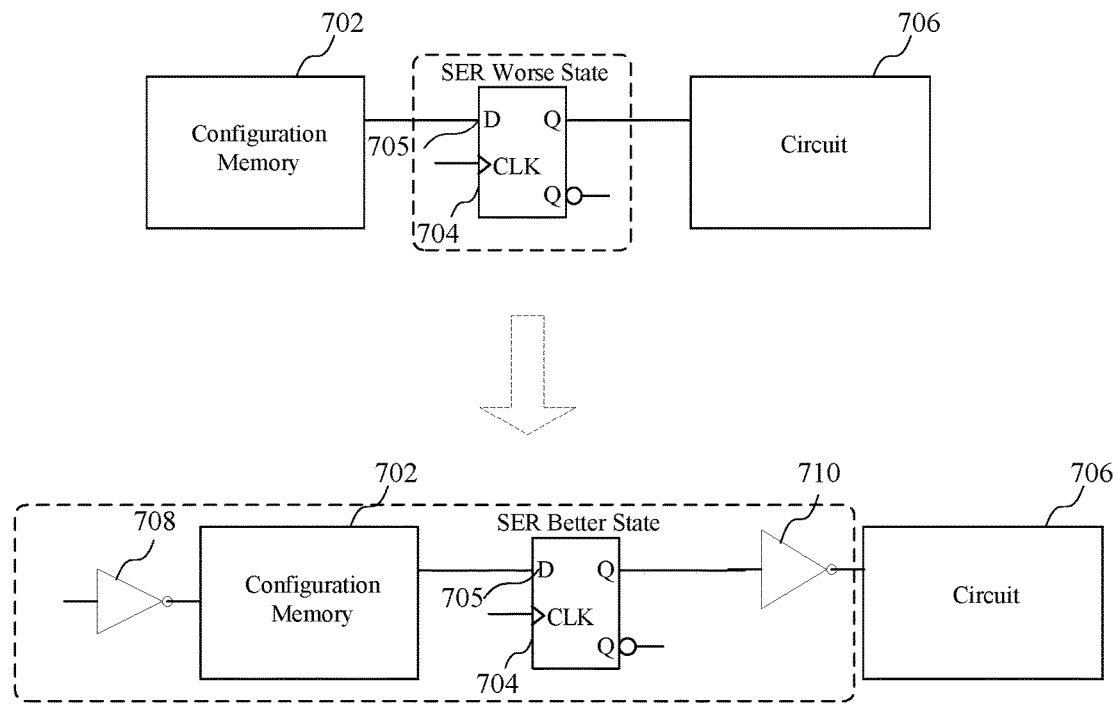
FIG. 7 shows a method of configuring a circuit for storing data.

Turning now to FIG. 7, a method of configuring a circuit for storing data is shown. As shown in FIG. 7, during a normal configuration of a memory element, a configuration memory 702 that is configured with a logical value (i.e. logical one or logical zero), is coupled to an input of a memory element 704, shown by way of example as a flip-flop, having an output coupled to another circuit 706. For example, during an initialization process, the value of the configuration memory is set to a certain value which is a desired value at the input or output of the memory element.

However, the value of the configuration memory 702 may place the memory element 704 in a worse state (i.e. the data of the memory element is more likely to be corrupted in the event of a radiation impact). A best state and a worse state of a memory element depends on the memory element, and can be empirically determined through testing. For example, the master-slave memory cell of FIG. 2 may have a lower FIT rate when the input to the memory cell is a logical "1", while a master-slave memory cell having a DICE memory element as the slave memory cell may have a lower FIT rate when the input to the memory cell is a logical "0". Therefore, the circuit can be configured so that the memory element is in a better state.

As shown in the top portion of FIG. 7, the logical value (e.g. logical "1") provided by the configuration memory 704 to the memory element 704 may place the memory element 704 in an SER Worse State (i.e. more likely to result in SEU in the event of a radiation strike than if the other logical value (i.e. logical "0") is provided by the configuration memory). Therefore, it is beneficial if the logical value provided by the configuration memory 702 could have the opposite value, and therefore lead to an SER better state. According to one implementation, a pair of inverters can be placed in the circuit to ensure that the same output is provided to the circuit 706, but the likelihood of an unintended changing of the data stored in the memory element, such as in response to a radiation strike, is reduced. As shown in the bottom portion of FIG. 7 after the transformation to a circuit having a better state, a first inverter 708 is coupled to the configuration memory to invert the data provided to the configuration memory, and therefore provide an input of the memory element 704 that places the memory element 704 in the best state for avoiding an unintended change of data of the memory element. An inverter 710 is placed at the output of the memory element to ensure that the correct data is provided to the circuit 706. By selectively configuring the memory elements of the integrated circuit to be implemented as shown either in the top portion of FIG. 7 or the bottom portion of FIG. 7, it is possible to improve the FIT rate of the integrated circuit. Examples of FFs that could be configured as described in FIG. 7 could include the memory elements 1202 at the output of the lookup tables of the configurable logic element of FIG. 12, as described in more detail below.

Figure 8:
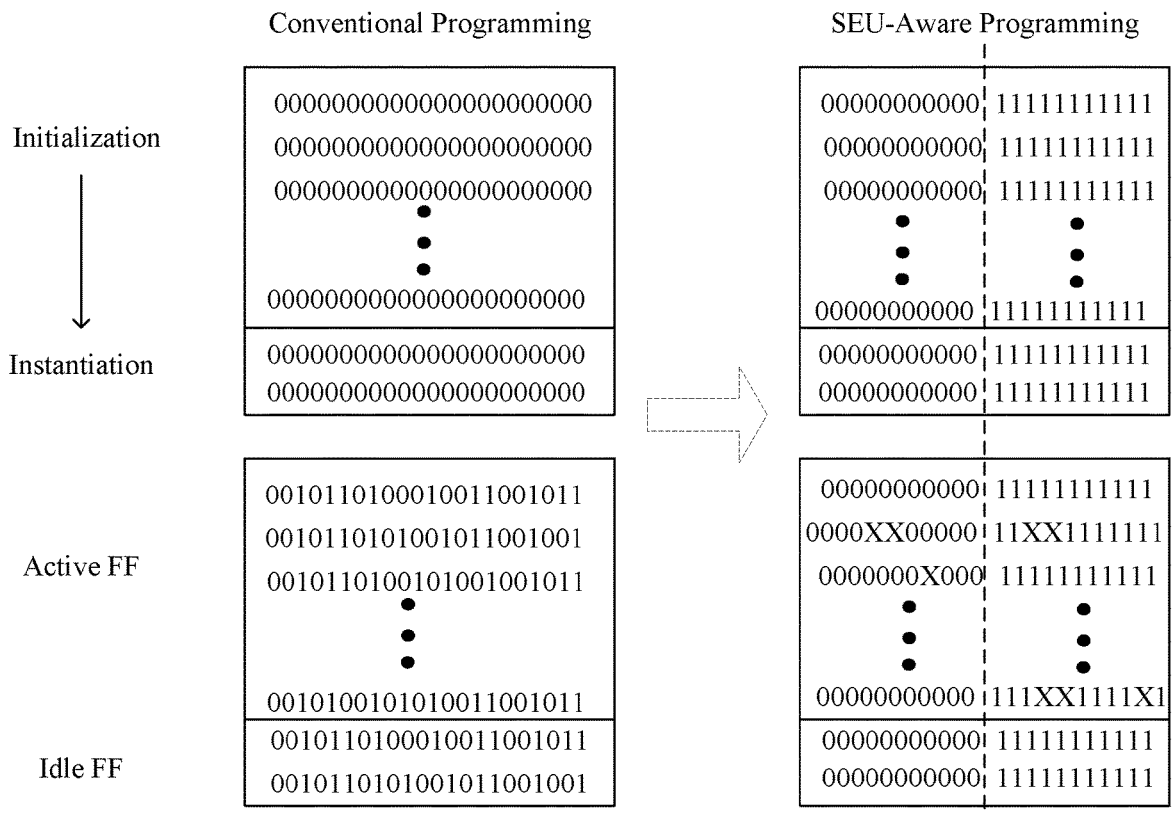
FIG. 8 is a diagram showing a method of configuring an integrated circuit device having SEU specific programming.

Turning now to FIG. 8, a diagram shows a method of configuring an integrated circuit device having SEU specific programming. As can be seen during an initialization phase of conventional programming, all of the configuration memory elements, such as configuration memory elements 702, are set to logical zeros. However, because applying a logical zero to the inputs of some memory elements may place those elements in an SER worse state, some of the registers programmed with configuration data are configured with the inverters 708 and 710 to place the register in a better state. Therefore, as shown in the SEU-Aware programming shown on the right (which corresponds to an implementation of the integrated circuit memory elements that are symmetrical or have an asymmetry (for storing a logical "1" or logical "0") and are selected for reducing the FIT rate of the integrated circuit), some memory elements will be programmed with a logical 0 at their inputs, and other memory elements will be programmed with a logical 1 at their inputs. The X values represent "don't care" values, which may correspond to data inputs that would be frequently toggling for example.

More particularly, during power up or idle mode, all FFs are initialized in their "better state". For example, a RTL synthesize software program can be used to coordinate instantiating FFs so that they are used in the "better state" in active designs, for example by instantiating inverters at the input and output of a FF when the FF is more likely to be used in the "worse state". For FFs that are in their better state, no change is made to the circuit (e.g. no additional inverters are added). By initializing and instantiating the FFs in the state with the lower FIT rate, the circuits and methods improve system-level SER FIT rate by up to 10 times with minimum area/performance penalty while minimizing system down-time.

A plurality of memory elements can be generated for a library of elements selected during the design of a circuit. When multiple memory elements are selectable from a library, it may be beneficial to include memory elements having SEU FIT rate asymmetry (for storing ones or zeros), rather than reducing asymmetry as described above by selectively placing dummy transistors to reduce asymmetry. That is, if a certain memory element is more likely to store a logical "1" for example, it may be beneficial to select a memory element having an asymmetry in the SEU FIT rate, where the memory element has lower SEU FIT rate for storing a logical "1". According to one implementation, FFs having the same functionality but different SEU FIT rate may be implemented. For example, a first FF may have a Low '0' state SEU FIT rate, a second FF may have a Low '1' state SEU FIT rate, and a third FF may have a Symmetric SEU FIT rate. For dynamically switching FF's it may be appropriate to instantiate a FF with symmetric SEU FIT (as the average FIT may be lowest for this FF) and this FF could have even capacitive loading added to Q & Q_bar nodes to reduce average SEU FIT. Alternatively, just 2 types of FFs could be included in the Library, including 'Symmetric' and 'Asymmetric," where the asymmetric can be modified as described in FIG. 7 (such as by adding inverters for example) to place a memory element that may have an asymmetry for receiving a logical "0" to have an asymmetry for receiving a logical "1".

Figure 9:
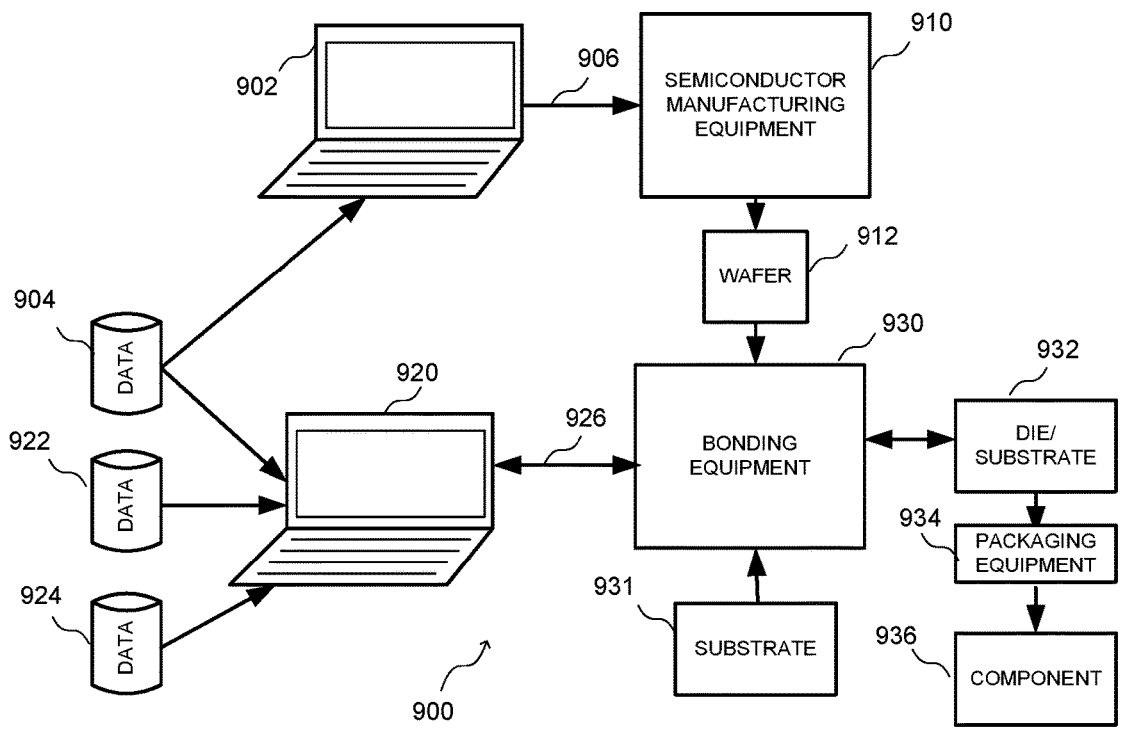
FIG. 9 is a block diagram of a system for producing an integrated circuit device.

An active design process can be used to place the appropriate SEU FF according to circuit analysis to choose a state that is 'most used', which could be performed for example on the system for producing an integrated circuit device of FIG. 9. A cell instantiation could include a choice of low 0' or low 1' FF or 'Symmetric' FF by a placer algorithm, where a symmetric FF may be selected if a memory element has a probability of receiving both logical ones and logical zeros so that the SEU FIT rate would be lower by choosing the symmetric FF than an symmetric flip flop. For each type of FF, it is determined whether an input '1' or '0' is associated with the "better state" or the "worse state" (i.e. better/worse SER FIT rate). FF profiling is then performed, where the FFs are categorized based on usage (i.e. control and data FFs). FF instantiation is then performed, where during power up or in idle mode, FFs are reset/set in the "better state". In active designs, control FFs instantiate in the "better state". Inverters are instantiated at input and output of the FF when the FF is more likely to be in "worse state".

Turning now to FIG. 9, a block diagram of a system for producing an integrated circuit device is shown, and particularly implementing a process of selecting FFs from a Cell Library that enable an improved FIT rate for an integrated circuit that is designed using the system 900. The system 900 comprises computer-aided design (CAD) equipment 902, which could be any computer adapted to run CAD software. The CAD equipment 902 receives data, such as a master schematic 904 based upon selected values for transistor and interconnect element design, and is coupled by a communication link 906 to semiconductor manufacturing equipment 910. CAD equipment 902 could be used to simulate and determine desired transistor and interconnect element values that improve or maximize performance, such as by selecting memory elements from a Cell Library that results in a reduced FIT rate as described above. The semiconductor manufacturing equipment 910 may generate a wafer 912 having a plurality of die, as is well known in the art.

CAD equipment 920, which is also coupled to receive the master schematic 904, receives a bonding diagram 922 and substrate artwork 924. The CAD equipment 920 is coupled by a communication link 926 to bonding equipment 930. The communication links 906 and 926 could be any wired or wireless communication link. The bonding equipment generally provides wire bonds from a die from the wafer 912 to a substrate 931 receiving the die, as will be described in more detail in reference to other figures. The die/substrate 932 is coupled to packaging equipment 934 which generates a finished component 936, such as an integrated circuit package. The system of FIG. 9 enables the manufacture of an integrated circuit package according to the various circuits and methods set forth above. Although the system of FIG. 9 provides various elements required for producing an integrated circuit package, it should be understood the elements shown in FIG. 9 could be combined, or additional elements could be provided.

Figure 10:
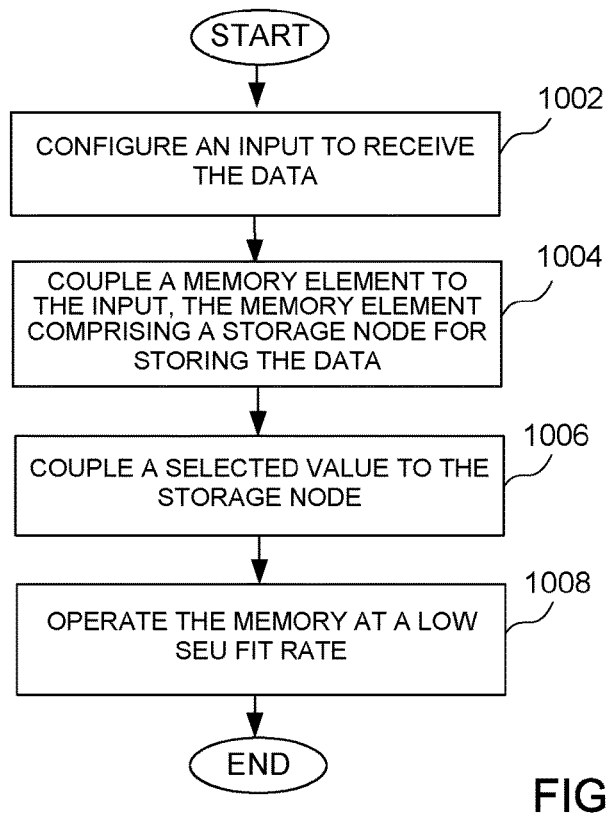
FIG. 10 is a flow chart showing a method of producing an integrated circuit device.

Turning now to FIG. 10, a flow chart shows a method of producing an integrated circuit device. An input configured to receive data at a block 1002. A memory element is coupled to the input at a block 1004, the memory element comprising a storage node for storing the data. A selected value is coupled to the storage node at a block 1006. Blocks 1002 and 1004 could be implemented to enable the selection of memory elements from a Cell Library to reduce FIT rate of an integrated circuit produced, such as an integrated circuit produced by the system 900 of FIG. 9. Memory element could be memory element 702, while the selected value could be the value stored in the configuration memory 702. The memory element is operated in a low SEU FIT state at a block 1008. A low SEU FIT state could be for example the lower SEU state of the two possible states (i.e. the memory element receiving a logical one or a logical zero).

The method may further comprise enabling a selection of a first type of memory element, such as a memory element using circuit 200, having a low SEU FIT rate for a receiving a logical zero and a second type of memory element, such as a memory element using circuit 200, having a low SEU FIT rate for receiving a logical one. The method may also comprise categorizing memory elements of the integrated circuit based upon usage (e.g. used as a control memory element or a data memory element), and selecting the first type of memory element or the second type of memory element based upon the categorized usage. According to one implementation the first type of memory element may be initialized and instantiated with a logical zero and the second type of memory element may be initialized and instantiated with a logical one during at least one of a power up mode or an idle mode. Circuit elements such as Inverters described in reference to FIG. 7, may be selectively inserted to enabling a type of memory element to have a low SEU FIT rate for receiving one of a logical zero or a logical one.

According to one implementation, a memory element, such as memory element 704 of FIG. 7 comprising a storage node may be configured to receive the data, the memory element comprising a storage node for storing the data. A selected value may be coupled to the storage node, wherein the selected value coupled to the storage node enables the memory element to operate at a low SEU FIT rate. The configuration memory 702 may comprise any element that can provide a selected value to the input of the memory element 704. According to one implementation, the configuration memory may comprise a lookup table configured to receive configuration data and generate an output that is coupled to the memory element 704, as described below in reference to the configurable logic element of FIG. 12. The method of FIG. 10 may be implemented using the circuits of FIGS. 1-9 as described, or may use some other suitable circuits. While specific elements of the method are described, it should be understood that additional elements of the method, or additional details related to the elements, could be implemented according to the disclosure of FIGS. 1-9.

Figure 11:
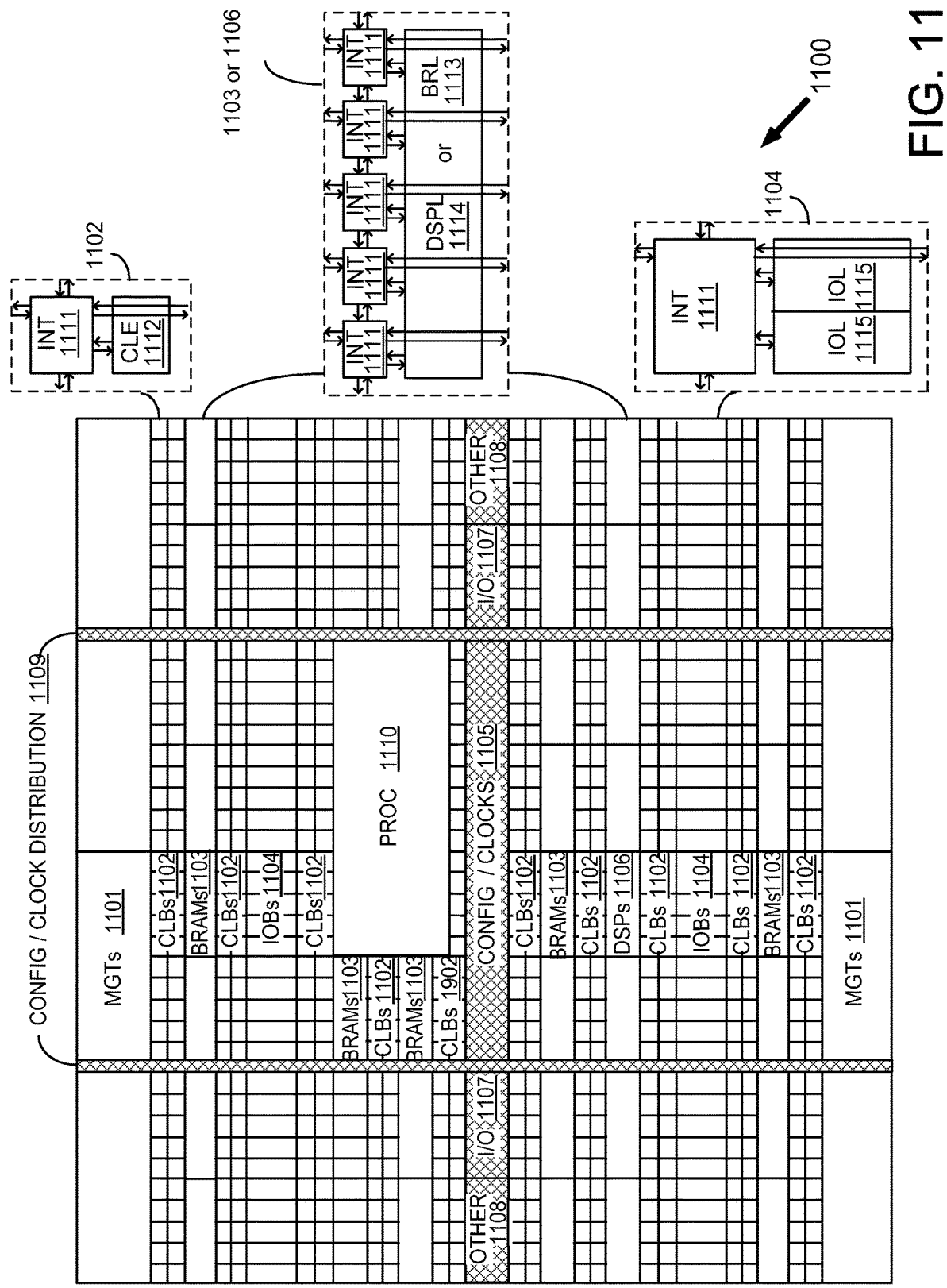
FIG. 11 is a block diagram of an integrated circuit device.

Turning now to FIG. 11, a block diagram of an integrated circuit device, and more particularly, a programmable logic device having memory elements, is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 11 comprises an FPGA architecture 1100 having a large number of different programmable tiles including multi-gigabit transceivers (MGTs) 1101, CLBs 1102, random access memory blocks (BRAMs) 1103, input/output blocks (IOBs) 1104, configuration and clocking logic (CONFIG/CLOCKS) 1105, digital signal processing blocks (DSPs) 1106, specialized input/output blocks (I/O) 1107 (e.g., configuration ports and clock ports), and other programmable logic 1108 such as digital clock managers, analog-to-digital converters, system monitoring logic, and so forth. Some FPGAs also include dedicated processor blocks (PROC) 1110, which may be used to implement a software application, for example.

In some FPGAs, each programmable tile includes a programmable interconnect element (INT) 1111 having standardized connections to and from a corresponding interconnect element in each adjacent tile. Therefore, the programmable interconnect elements taken together implement the programmable interconnect structure for the illustrated FPGA. The programmable interconnect element 1111 also includes the connections to and from the programmable logic element within the same tile, as shown by the examples included at the top of FIG. 11.

For example, a CLB 1102 may include a configurable logic element (CLE) 1112 that may be programmed to implement user logic plus a single programmable interconnect element 1111. A BRAM 1103 may include a BRAM logic element (BRL) 1113 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 1106 may include a DSP logic element (DSPL) 1114 in addition to an appropriate number of programmable interconnect elements. An IOB 1104 may include, for example, two instances of an input/output logic element (IOL) 1115 in addition to one instance of the programmable interconnect element 1111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 1109 extending from this column are used to distribute the clocks and configuration signals across the breadth of the FPGA. Some FPGAs utilizing the architecture illustrated in FIG. 11 include additional logic blocks that disrupt the regular columnar structure making up a large part of the FPGA. The additional logic blocks may be programmable blocks and/or dedicated logic. For example, the processor block PROC 1110 shown in FIG. 11 spans several columns of CLBs and BRAMs.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear in order to facilitate the efficient implementation of user logic. While the implementation of FIG. 11 relates to an integrated circuit having programmable resources, it should be understood that the circuits and methods set forth above could be implemented in any type of device having a combination of programmable resources and hard blocks.

Figure 12:
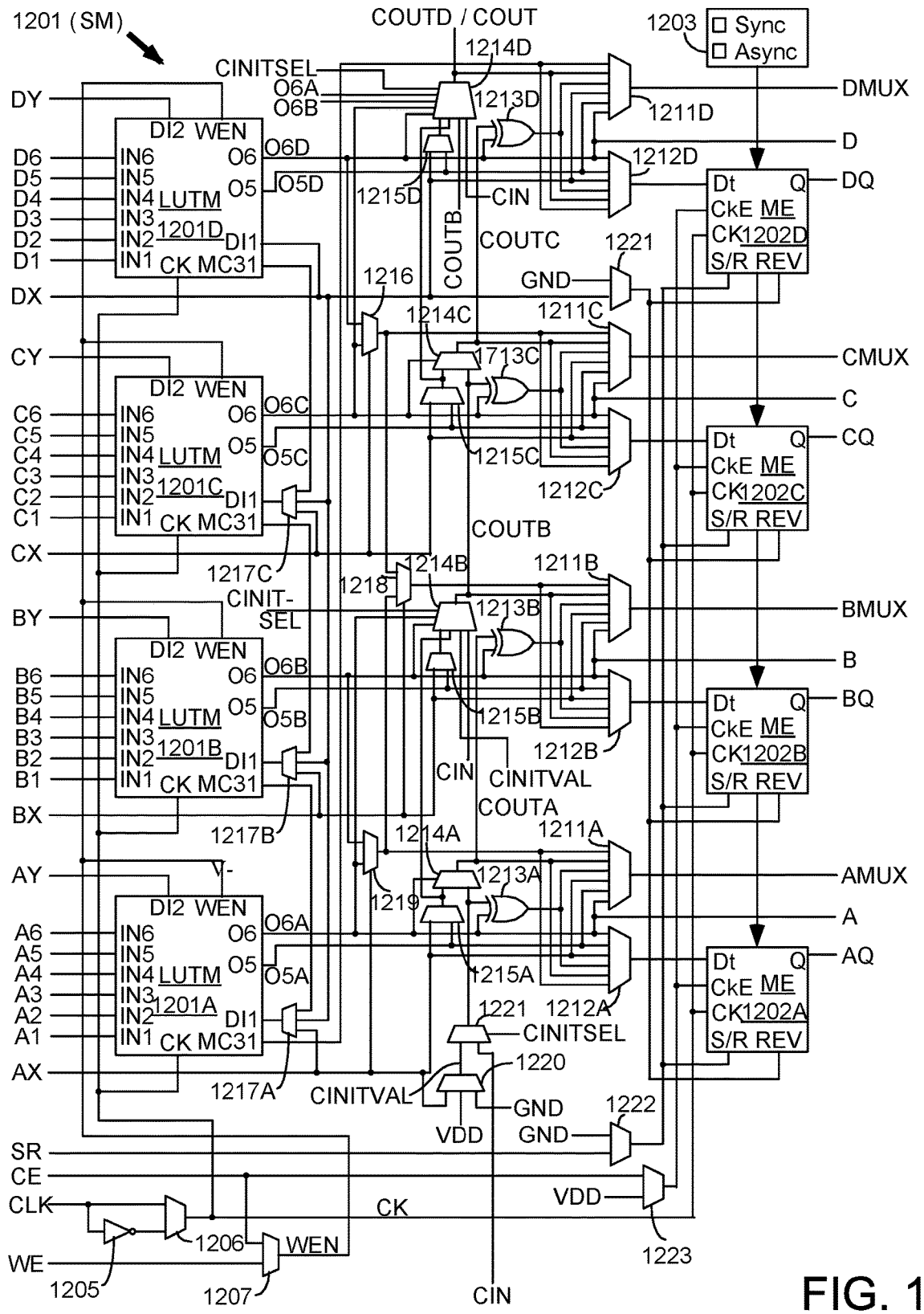
FIG. 12 is a block diagram of a configurable logic element of the integrated circuit device of FIG. 11.

Turning now to FIG. 12, a block diagram of a configurable logic element that could be implemented in FIG. 11 is shown. In particular, FIG. 12 illustrates in simplified form a configurable logic element, which is an example of Programmable Logic, of a configuration logic block 1102 of FIG. 11. In the implementation of FIG. 12, slice M 1201 includes four lookup tables (LUTMs) 1201A-1201D, each driven by six LUT data input terminals A1-A6, B1-B6, C1-C6, and D1-D6 and each providing two LUT output signals O5 and O6. The O6 output terminals from LUTs 1201A-1201D drive slice output terminals A-D, respectively. The LUT data input signals are supplied by the FPGA interconnect structure via input multiplexers, which may be implemented by programmable interconnect element 1211, and the LUT output signals are also supplied to the interconnect structure. Slice M also includes: output select multiplexers 1211A-1211D driving output terminals AMUX-DMUX; multiplexers 1212A-1812D driving the data input terminals of memory elements 1202A-1202D; combinational multiplexers 1216, 1218, and 1219; bounce multiplexer circuits 1222-1223; a circuit represented by inverter 1205 and multiplexer 1206 (which together provide an optional inversion on the input clock path); and carry logic having multiplexers 1214A-1814D, 1215A-1815D, 1220-1221 and exclusive OR gates 1213A-1213D. All of these elements are coupled together as shown in FIG. 12. Where select inputs are not shown for the multiplexers illustrated in FIG. 12, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 18 for clarity, as well as from other selected figures herein.

In the pictured implementation, each memory element 1202A-1202D may be programmed to function as a synchronous or asynchronous flip-flop or latch. The selection between synchronous and asynchronous functionality is made for all four memory elements in a slice by programming Sync/Asynch selection circuit 1203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1202A-1202D are clocked by a clock signal CK, which may be provided by a global clock network or by the interconnect structure, for example. Such programmable memory elements are well known in the art of FPGA design. Each memory element 1202A-1202D provides a registered output signal AQ-DQ to the interconnect structure. Because each LUT 1201A-1201D provides two output signals, O5 and O6, the LUT may be configured to function as two 5-input LUTs with five shared input signals (IN1-IN5), or as one 6-input LUT having input signals IN1-IN6.

In the implementation of FIG. 12, each LUTM 1201A-1201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1217A-1217C for LUTs 1201A-1201C), or to the two 32-bit RAMs via input terminals DI1 and DI2. RAM write operations in the LUT RAMs are controlled by clock signal CK from multiplexer 1206 and by write enable signal WEN from multiplexer 1207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1201A may also be provided to the general interconnect structure for shift register chaining, via output select multiplexer 1211D and CLE output terminal DMUX. Accordingly, the circuits and methods set forth above may be implemented in a device such as the devices of FIGS. 11 and 12, or any other suitable device. While a PLD such as the FPGA of FIGS. 11 and 12 are shown by way of example, the circuits and methods of storing data, including designing circuits by selecting asymmetrical or symmetrical memory elements from a Cell Library, can be implemented for any type of integrated circuit, including an application specific integrated circuit (ASIC).

It can therefore be appreciated that new circuits for and methods of storing data in an integrated circuit have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for storing data in an integrated circuit, the circuit comprising:
    an input adapted to receive the data;
    a memory element coupled to the input, the memory element comprising a storage node for storing the data;
    at least one node that is separate from the storage node for storing the data; and
    at least a portion of a dummy transistor coupled to the at least one node that is separate from the storage node for storing the data;
    wherein the at least one node that is separate from the storage node for storing the data comprises an input node for the memory element.

2. The circuit of claim 1, further comprising an input buffer, wherein the data is coupled to an input of the input buffer and the input node comprises an output of the input buffer.

3. The circuit of claim 1, further comprising a second dummy transistor coupled to a second node that is separate from the storage node for storing the data, wherein the second node comprises a reference node.

4. The circuit of claim 1, wherein the at least one node is separated from the storage node by a pass gate.

5. The circuit of claim 1, wherein the memory element comprises a latch having the storage node and a second storage node.

6. The circuit of claim 5, wherein the latch comprises an inverter having a plurality of transistors coupled in series and having the storage node, the circuit further comprises at least a portion of a second dummy transistor coupled to a node of the plurality of transistors separate from the storage node.

7. A method of storing data in an integrated circuit, the method comprising:
    configuring an input to receive the data;
    coupling a memory element to the input, the memory element comprising a storage node for storing the data;
    providing at least one node that is separate from the storage node for storing the data; and
    coupling at least a portion of a dummy transistor to the at least one node that is separate from the storage node for storing the data;
    wherein the at least one node is separated from the storage node by a pass gate.

8. The method of claim 7, wherein providing at least one node that is separate from the storage node for storing the data comprises providing an input node for the memory element.

9. The method of claim 8, further comprising coupling the input data to an input of an input buffer, wherein the input node comprises an output of the input buffer.

10. The method of claim 7, wherein providing at least one node that is separate from the storage node for storing the data comprises providing a reference node.

11. The method of claim 7, wherein coupling the memory element to the input comprises providing a latch having the storage node and a second storage node.

12. A method of storing data in an integrated circuit, the method comprising:
    enabling a selection of a first type of memory element having a low FIT rate for a receiving a logical zero and a second type of memory element having a low FIT rate for receiving a logical one;
    configuring a memory element to receive the data, the memory element comprising a storage node for storing the data; and
    coupling a selected value to the storage node;
    wherein the selected value coupled to the storage node enables the memory element to operate at a low FIT rate.

13. The method of claim 12, wherein the integrated circuit comprises a configurable logic element, and coupling a selected value to the storage node comprises programming configuration memory of the configurable logic element.

14. The method of claim 12, wherein further comprising categorizing the memory elements of the integrated circuit based upon usage, and selecting the first type of memory element or the second type of memory element based upon the categorized usage.

15. The method of claim 12, further comprising instantiating the first type of memory element with a logical zero and the second type of memory element with a logical one during at least one of a power up mode or an idle mode.

16. The method of claim 12, further comprising implementing a first type of memory element having a low FIT rate for a receiving one of a logical zero or a logical one, and selectively inserting inverters enabling a second type of memory element to have a low FIT rate for receiving the other of a logical zero or a logical one.

* * * * *